(12) United States Patent
Kang et al.

(10) Patent No.: US 6,306,704 B1
(45) Date of Patent: Oct. 23, 2001

(54) NONVOLATILE FERROELECTRIC MEMORY

(75) Inventors: Hee Bok Kang, Taejeon-si; Doo Young Yang, Chungcheongbuk-do, both of (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/556,974

(22) Filed: Apr. 24, 2000

Related U.S. Application Data

(62) Division of application No. 09/157,947, filed on Sep. 22, 1998, now Pat. No. 6,055,175.

(30) Foreign Application Priority Data

Jun. 30, 1998 (KR) ................................................ 98-25917

(51) Int. Cl.⁷ ............................................... H01L 21/8234
(52) U.S. Cl. ......................... 438/238; 438/240; 438/253
(58) Field of Search ................................. 438/238, 240, 438/253, FOR 212, FOR 220; 365/145

(56) References Cited

U.S. PATENT DOCUMENTS

| 4,433,390 | 2/1984 | Carp et al. ........................... 364/900 |
|---|---|---|
| 4,873,664 | 10/1989 | Eaton, Jr. ............................. 365/145 |
| 4,888,630 | 12/1989 | Paterson ............................. 357/23.5 |
| 4,928,095 | 5/1990 | Kawahara ........................... 340/784 |
| 5,010,518 | 4/1991 | Toda .................................... 265/145 |
| 5,189,594 | * 2/1993 | Hoshiba . |
| 5,293,510 | * 3/1994 | Takenaka . |
| 5,371,699 | 12/1994 | Larson ................................. 365/145 |
| 5,628,318 | 5/1997 | Seyyedy ............................. 365/145 |
| 5,680,344 | 10/1997 | Seyyedy ............................. 365/145 |
| 5,804,850 | 9/1998 | Evans, Jr. et al. ................... 257/295 |
| 5,898,609 | 4/1999 | Yoo ................................. 365/148 X |

* cited by examiner

Primary Examiner—George Fourson
Assistant Examiner—Thanh Pham
(74) Attorney, Agent, or Firm—Fleshner & Kim, LLP

(57) ABSTRACT

A nonvolatile ferroelectric memory comprising a main memory cell blocks including first and second wordlines, a first cell transistor whose gate is connected to the first wordline and one electrode which is connected to a bitline, a second transistor whose gate is connected to the second wordline and one electrode which is connected to a bit bar line, a first ferroelectric capacitor whose first electrode is connected to the other electrode of the first transistor. Also including reference cell blocks formed to correspond to the main memory cell blocks for reading out data of the memory cell blocks.

23 Claims, 12 Drawing Sheets

NONVOLATILE FERROELECTRIC MEMORY

This application is a Divisional of application Ser. No. 09/157,947 filed Sept. 22, 1998, now U.S. Pat. No. 6,055,175.

BACKGROUND OF THE INVENTION

1. Field of the Invention

The present invention relates to a semiconductor memory device, and more particularly, to a nonvolatile ferroelectric memory in which one cell has a structure of 1T/1C/1R to enable high speed access operation and efficiently prevent a reference cell from being degraded.

2. Discussion of the Related Art

A background art nonvolatile ferroelectric memory will be described with reference to the accompanying drawings.

FIG. 1 is a hysteresis loop of a typical ferroelectric. FIG. 2 is a circuit diagram illustrating a background art ferroelectric memory.

Generally, a ferroelectric memory, that is, ferroelectric random access memory (FRAM) has received much attention for use in a next generation memory device. The ferroelectric memory has processing speed as much as DRAM (dynamic random access memory) used in a semiconductor memory device, and retains data even in the event of power-off. The FRAM which has the almost same structure as the DRAM is a memory device in which data are not erasable even if electric field is removed using high residual polarization characteristic of a ferroelectric used as a material of a capacitor.

In other words, as shown in hysteresis loop of FIG. 1, the polarization organized by the electric field is maintained at a constant amount (d, a state) without extinction due to spontaneous polarization even if the electric field is removed. For application of a memory device, d, a correspond to 1, 0, respectively.

The background art nonvolatile ferroelectric memory device, in general, includes a main memory cell block 1 and a reference cell block 2. The background art nonvolatile ferroelectric memory device includes a sensing amplifier/bitline control block 3 for reading out data of the main memory cell block 1 using the reference cell block 2.

The aforementioned background art nonvolatile ferroelectric memory device will be described in detail.

The main memory cell block 1 includes first and second wordlines WL1 and WL2, a first cell transistor MN1 whose gate is connected to the first wordline WL1 and one electrode is connected to a bitline Bit_line, a second transistor MN2 whose gate is connected to the second wordline WL2 and one electrode is connected to a bit bar line BitB_line, a first ferroelectric capacitor FC1 whose first electrode is connected to the other electrode of the first transistor MN1 and second electrode is connected to a cell plate line PL1, and a second ferroelectric capacitor FC2 whose first electrode is connected to the other electrode of the second transistor MN2 and second electrode is connected to the cell plate line PL1.

The reference cell block 2 includes first and second wordlines WL1 and WL2, a reference transistor RN1 whose gate is connected to the second wordline WL2 and one electrode is connected to the bitline Bit_line, a second reference transistor RN2 whose gate is connected to the first wordline WL1 and one electrode is connected to the bit bar line BitB_line, a first reference ferroelectric capacitor RFC1 whose first electrode is connected to the other electrode of the first reference transistor RN1 and second electrode is connected to a plate line PL1, and a second reference ferroelectric capacitor FRC2 whose first electrode is connected to the other electrode of the second reference transistor RN2 and second electrode is connected to the plate line PL1.

The sensing amplifier/bitline control block 3 includes a bitline control block and a sensing amplifier block. The bitline control block includes first and second NMOS transistors N1 and N2 whose gates are in common connected to a bitline control signal input terminal PBL, one electrodes are connected to the bitline and the bit bar line, respectively, and the other electrodes are connected to a ground terminal Vss, and third, fourth and fifth NMOS transistors N3, N4 and N5 whose gates are in common connected to a bit bar line control signal input terminal EBL. The sensing amplifier block includes first and second PMOS transistors P1 and P2 whose one electrodes are in common connected to a sensing amplifier PMOS enable signal input terminal SAP, and sixth and seventh NMOS transistors N6 and N7 whose one electrodes are in common connected to a sensing amplifier NMOS enable signal input terminal SAN.

Source and drain of the fifth NMOS transistor N5 are connected to the bitline and the bit bar line, respectively.

One electrodes of the third and fourth transistors N3 and N4 are in common connected to a precharge signal input terminal Vcc/2 and the other electrodes thereof are connected to the bitline and the bit bar line, respectively.

Gates of the first PMOS transistor P1 and the sixth NMOS transistor N6 and the other electrodes of the second PMOS transistor P2 and the seventh NMOS transistor N7 are in common connected to the bit bar line.

Gates of the second PMOS transistor P2 and the seventh NMOS transistor N7 and the other electrodes of the first PMOS transistor P1 and the sixth NMOS transistor N6 are in common connected to the bit line.

Data sensing operation of the background art nonvolatile ferroelectric memory device will be described below.

If a low signal is applied through the bitline control signal input terminal PBL, the bitline and the bit bar line are separated from the ground voltage Vss.

If a wordline driving signal W/L is applied at high level, a data signal output from the first ferroelectric capacitor FC1 is transmitted to the bitline Bit_line. At this time, a data signal output from the second reference ferroelectric capacitor RFC2 of the reference cell is transmitted to the bit bar line BitB_line.

The sensing amplifier block amplifies voltage difference between the bit line and the bit bar line. The bitline and the bit bar line are equalized by Vcc/2, so that a voltage at both ends of the first and second ferroelectric capacitors FC1 and FC2 becomes 0V. Further, the wordline becomes Vss level, and the bitline and bit bar line become Vss level if a high signal is applied through the bitline control signal input terminal PBL.

The background art nonvolatile ferroelectric memory device has several problems.

At a standby mode, a node cn1 and a node cn2 become floating state. Therefore, a memory voltage of the nodes cn1 and cn2 drops to 0V due to junction leakage or PL1 voltage is maintained at Vcc/2. This applies inverse bias to the ferroelectric capacitor, thereby resulting in that stored data are lost. To avoid such data loss, there must be provided a circuit for compensating a voltage of a node within the memory cell and a compensating cycle.

SUMMARY OF THE INVENTION

Accordingly, the present invention is directed to a nonvolatile ferroelectric memory that substantially obviates one or more of the problems due to limitations and disadvantages of the related art.

An object of the present invention is to provide a nonvolatile ferroelectric memory in which one cell has a structure of 1T/1C/1R to enable high speed access operation and efficiently prevent a reference cell from being degraded.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a nonvolatile ferroelectric memory according to the present invention includes: main memory cell blocks including first and second wordlines WL1 and WL2, a first cell transistor MN1 whose gate is connected to the first wordline WL1 and one electrode is connected to a bitline Bit_line, a second transistor MN2 whose gate is connected to the second wordline WL2 and one electrode is connected to a bit bar line BitB_line, a first ferroelectric capacitor FC1 whose first electrode is connected to the other electrode of the first transistor MN1 and second electrode is connected to a Vcc/2 voltage applying line hvcc, a first resistor device RM1 formed between a first node n1 for connecting the other electrode of the first transistor MN1 with the first electrode of the first ferroelectric capacitor FC1 and the Vcc/2 voltage applying line hvcc, a second ferroelectric capacitor FC2 whose first electrode is connected to the other electrode of the second transistor MN2 and second electrode is connected to the Vcc/2 voltage applying line hvcc, and a second resistor device RM2 formed between a second node n2 for connecting the other electrode of the second transistor MN2 with the first electrode of the second ferroelectric capacitor FC2 and the Vcc/2 voltage applying line hvcc; and reference cell blocks formed to correspond to the main memory cell blocks, for reading out data of the memory cell blocks.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 4a-1 to 4g-2 are layouts and sectional views illustrating a ferroelectric memory according to the present invention;

DETAILED DESCRIPTION OF THE PREFERRED EMBODIMENTS

Reference will now be made in detail to the preferred embodiments of the present invention, examples of which are illustrated in the accompanying drawings.

A nonvolatile ferroelectric memory according to the present invention is intended that resistor devices are in parallel formed at both ends of a capacitor, so that there are no additionally required a circuit for compensating a voltage of a node within a memory cell and a separate compensating cycle.

The nonvolatile ferroelectric memory according to the present invention in general includes a memory cell block 31 and a reference block 32. The nonvolatile ferroelectric memory includes a sensing amplifier/bitline control block 33 for reading out data of the memory cell block 31 using the reference cell block 32.

The nonvolatile ferroelectric memory according to the present invention will be described in detail.

Figure 1:
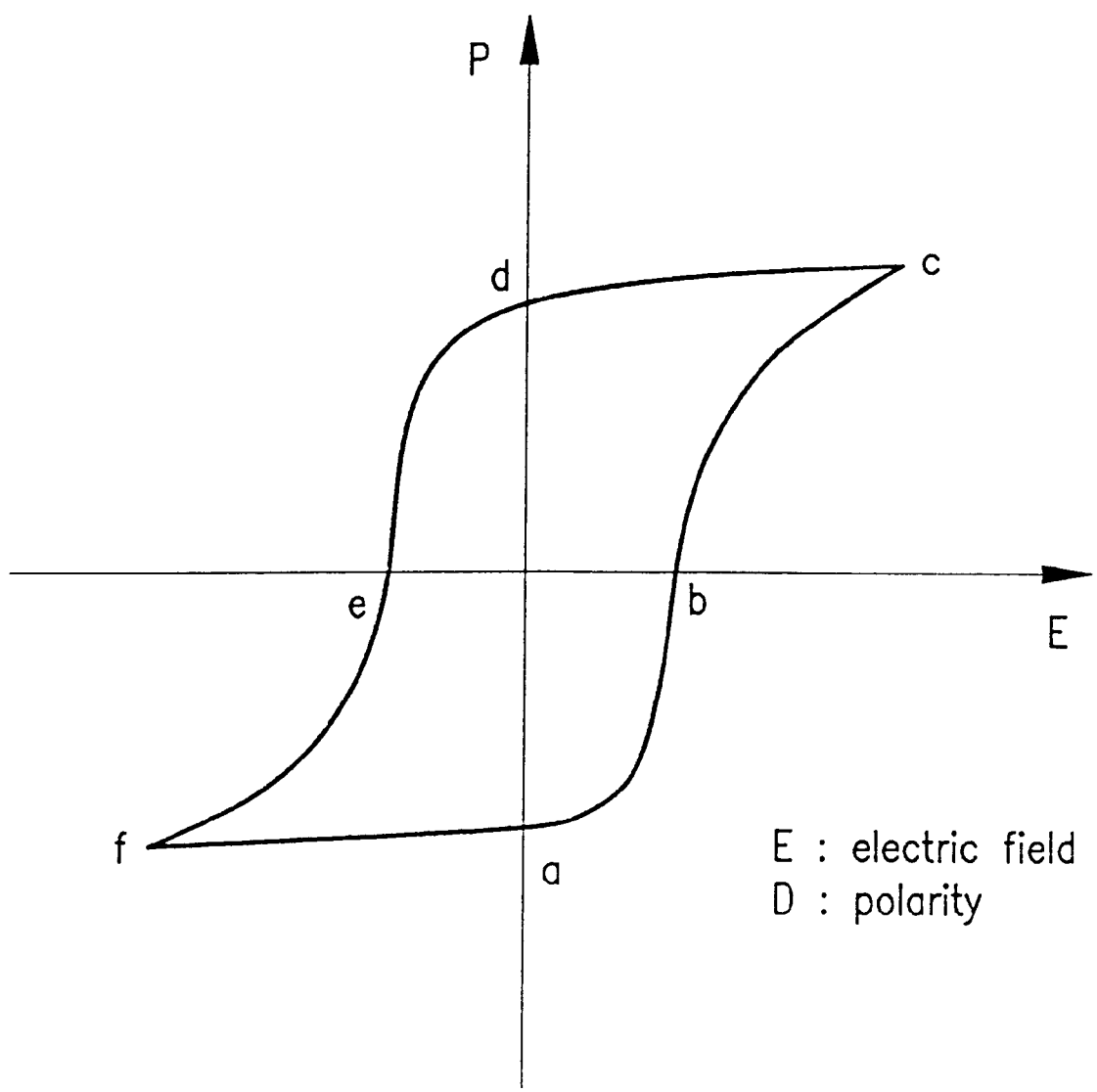
FIG. 1 is a hysteresis loop of a typical ferroelectric.
Figure 2:
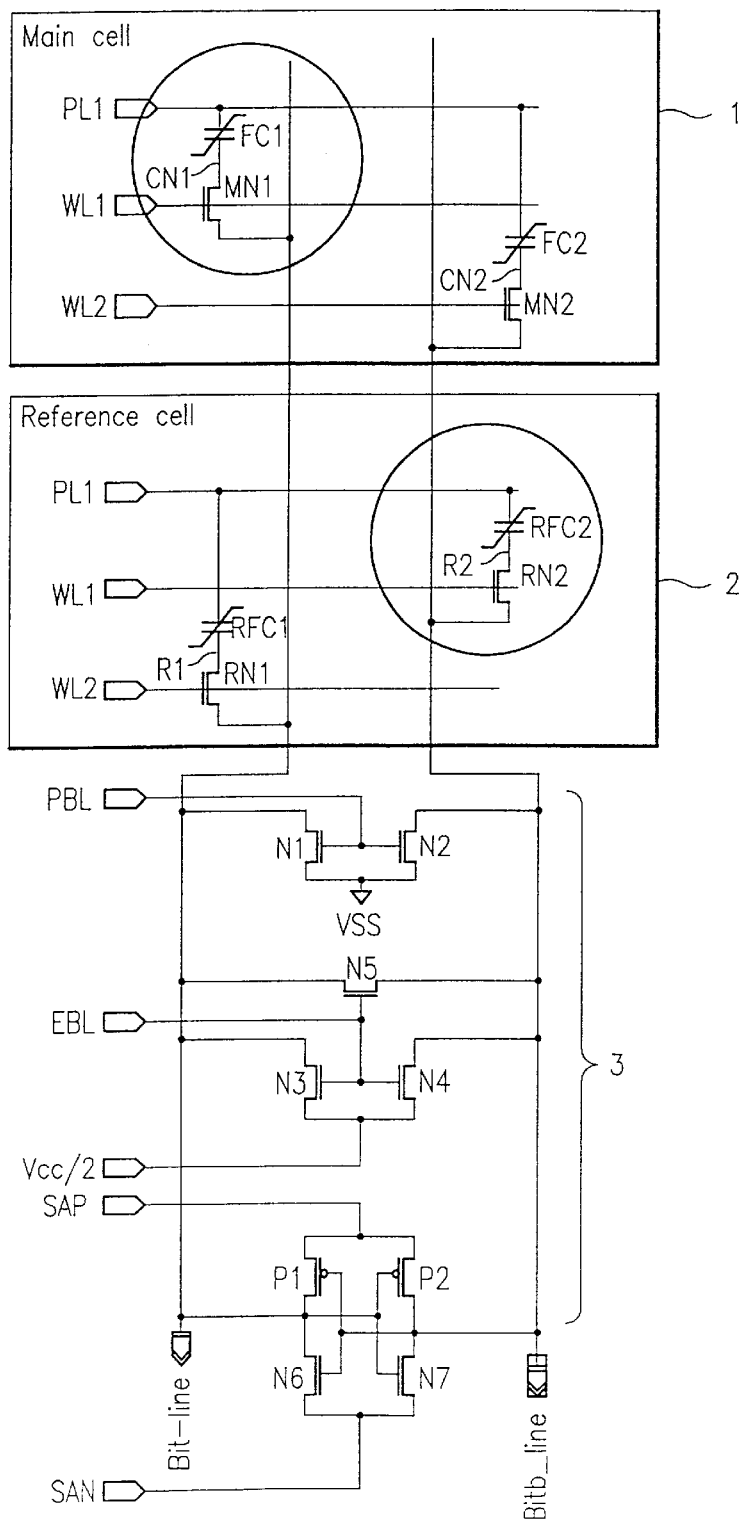
FIG. 2 is a circuit diagram illustrating a background art ferroelectric memory.
Figure 3:
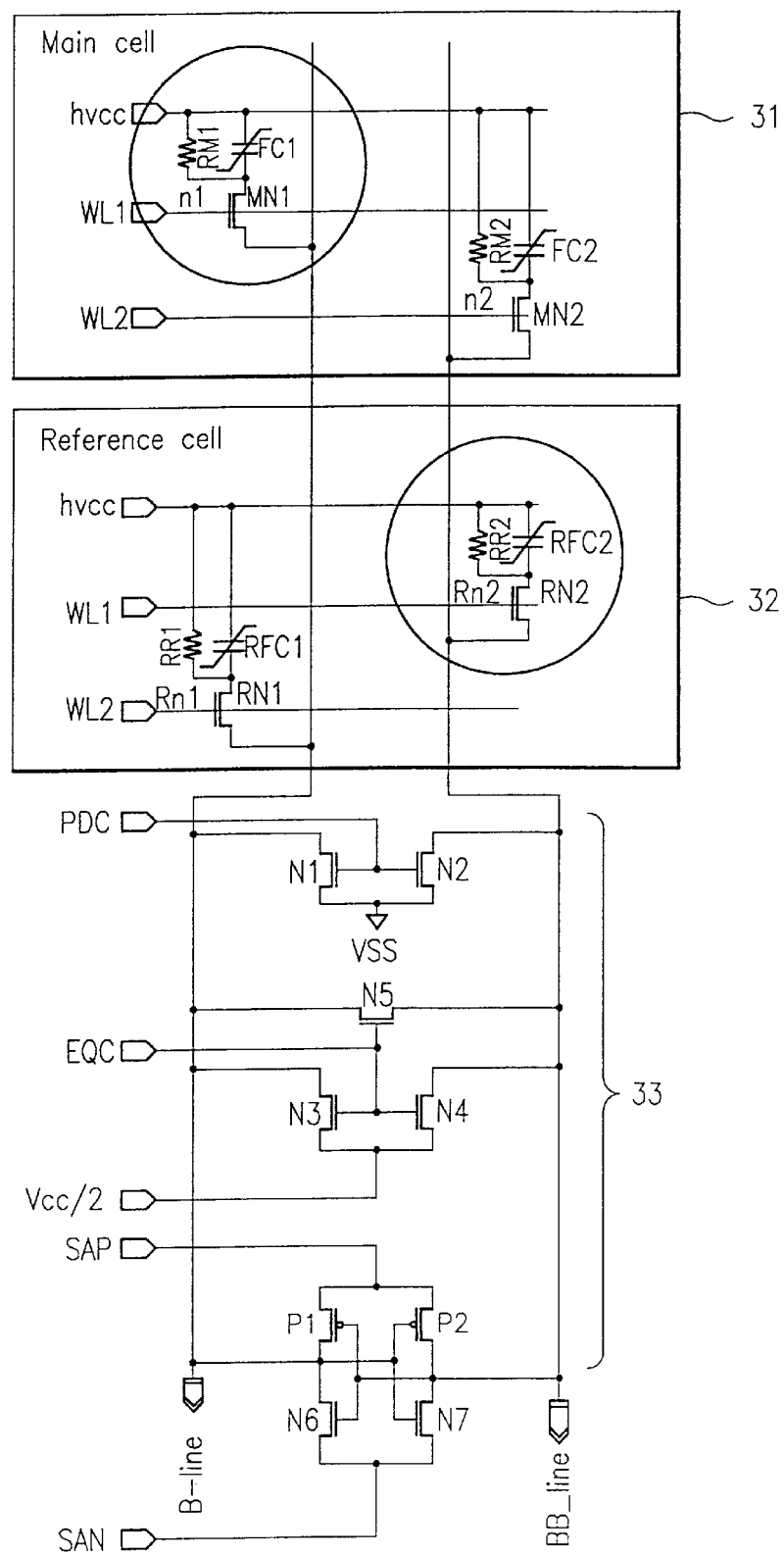
FIG. 3 is a circuit diagram illustrating a ferroelectric memory according to the present invention.

As shown in FIG. 3, the main memory cell block 31 includes first and second wordlines WL1 and WL2, a first cell transistor MN1 whose gate is connected to the first wordline WL1 and one electrode is connected to a bitline Bit_line, a second transistor MN2 whose gate is connected to the second wordline WL2 and one electrode is connected to a bit bar line BitB_line, a first ferroelectric capacitor FC1 whose first electrode is connected to the other electrode of the first transistor MN1 and second electrode is connected to a Vcc/2 voltage applying line hvcc, a first resistor device RM1 formed between a first node n1 for connecting the other electrode of the first transistor MN1 with the first electrode of the first ferroelectric capacitor FC1 and the Vcc/2 voltage applying line hvcc, a second ferroelectric capacitor FC2 whose first electrode is connected to the other electrode of the second transistor MN2 and second electrode is connected to the Vcc/2 voltage applying line hvcc, and a second resistor device RM2 formed between a second node n2 for connecting the other electrode of the second transistor MN2 with the first electrode of the second ferroelectric capacitor FC2 and the Vcc/2 voltage applying line hvcc.

The reference cell block 32 includes first and second wordlines WL1 and WL2, a first reference transistor RN1 whose gate is connected to the second wordline WL2 and one electrode is connected to the bitline Bit_line, a first reference ferroelectric capacitor RFC1 whose first electrode is connected to the other electrode of the first reference transistor RN1 and second electrode is connected to the Vcc/2 voltage applying line hvcc, a first resistor device RR1 formed between a first node Rn1 for connecting the other electrode of the first reference transistor RN1 with the first electrode of the first reference ferroelectric capacitor RFC1 and the Vcc/2 voltage applying line hvcc, a second reference transistor RN2 whose gate is connected to the second wordline WL2 and one electrode is connected to the bit bar line BitB_line, a second reference ferroelectric capacitor RFC2 whose first electrode is connected to the other electrode of the second reference transistor RN2 and second electrode is connected to the Vcc/2 voltage applying line hvcc, and a second resistor device RR2 formed between a second node Rn2 for connecting the other electrode of the second reference transistor RN2 with the first electrode of the first reference ferroelectric capacitor RFC1 and the Vcc/2 voltage applying line hvcc.

The sensing amplifier/bitline control block 33 includes a bitline control block and a sensing amplifier block. The bitline control block includes first and second NMOS transistors N1 and N2 whose gates are in common connected to a pull-down control signal input terminal PDC, one electrodes are connected to the bitline and the bit bar line, respectively, and the other electrodes are connected to a ground terminal Vss, and third, fourth and fifth NMOS transistors N3, N4 and N5 whose gates are in common connected to a pull-up control signal input terminal EQC. The sensing amplifier block includes first and second PMOS transistors P1 and P2 whose one electrodes are in common connected to a sensing amplifier PMOS enable signal input terminal SAP, and sixth and seventh NMOS transistors N6 and N7 whose one electrodes are in common connected to a sensing amplifier NMOS enable signal input terminal SAN.

Source and drain of the fifth NMOS transistor N5 are connected to the bitline and the bit bar line, respectively.

One electrodes of the third and fourth transistors N3 and N4 are in common connected to a precharge signal input terminal Vcc/2 and the other electrodes thereof are connected to the bitline and the bit bar line, respectively.

Gates of the first PMOS transistor P1 and the sixth NMOS transistor N6 and the other electrodes of the second PMOS transistor P2 and the seventh NMOS transistor N7 are in common connected to the bit bar line.

Gates of the second PMOS transistor P2 and the seventh NMOS transistor N7 and the other electrodes of the first PMOS transistor P1 and the sixth NMOS transistor N6 are in common connected to the bit line.

The section structure and the process steps for the unit cell of the nonvolatile ferroelectric memory device according to the present invention will be described below.

FIGS. 4a to 4g are layouts and sectional views illustrating the ferroelectric memory according to the present invention.

The nonvolatile ferroelectric memory of the present invention comprises a semiconductor substrate 40 including an active region defined by a device isolation layer 41, cell transistors including gate and source/drain regions in the active region of the semiconductor substrate 40, a capacitor first electrode 47b contacted with one region of the source/drain regions, a ferroelectric layer 48 including a resistor region 49 at one side on the capacitor first electrode 47b, a capacitor second electrode 50 formed on the ferroelectric layer 48, and a bitline 51 contacted with the other region of the source/drain regions of the cell transistors.

The process steps of the ferroelectric memory having the aforementioned sectional structure, according to the present invention, will be described below.

Figures 1, 4A:
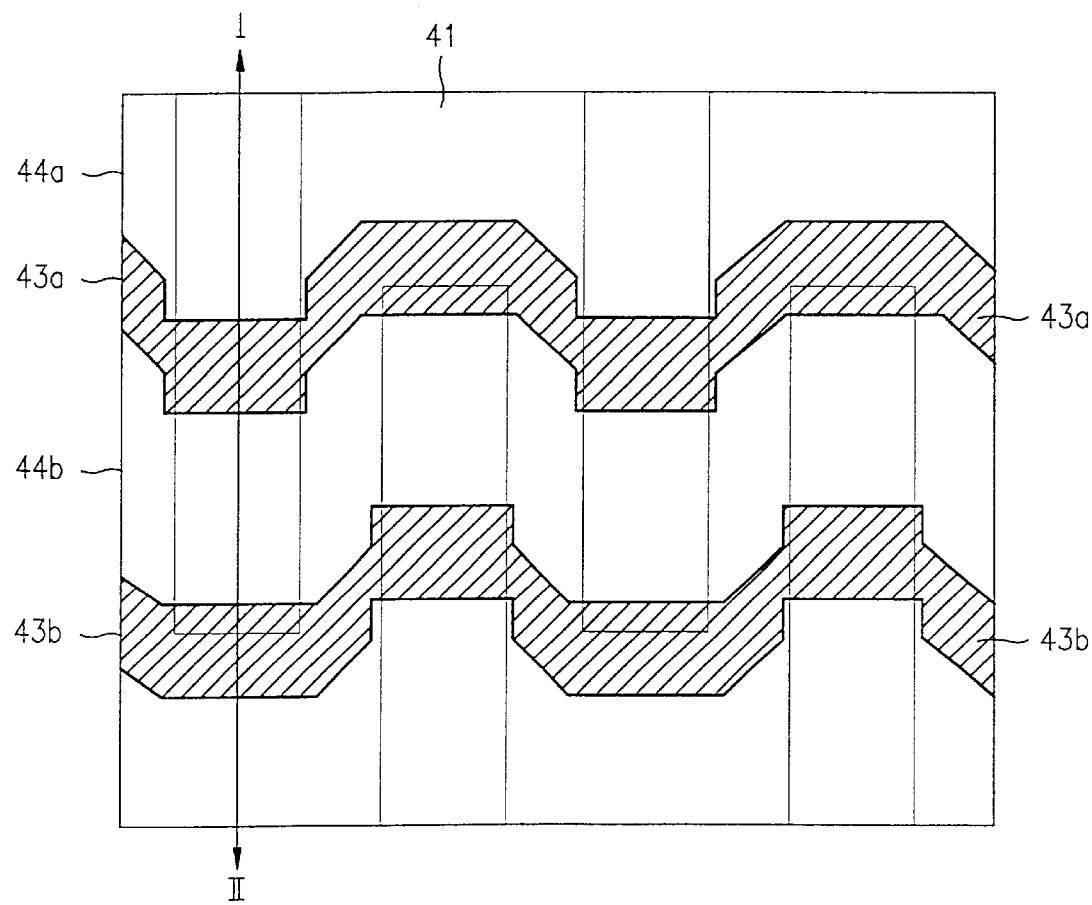
Figures 2, 4A:
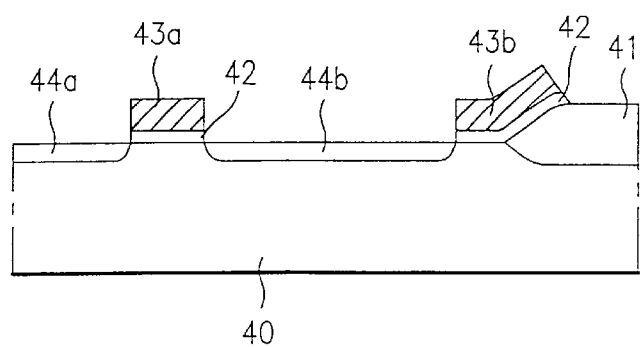

As shown in FIG. 4a, a device isolation layer 41 is formed in a device isolation region of a semiconductor substrate 40 by field oxidation process. A gate oxide layer 42, is formed on the substrate. A gate layer, i.e., a polysilicon layer for the formation of gate is formed on an entire surface of the semiconductor substrate 40 and then selectively patterned to form first and second wordlines 43a and 43b.

Subsequently, impurity ions are implanted into the active region using the first and second wordlines 43a and 43b as masks to form source/drain regions 44a and 44b.

Figures 1, 4B:
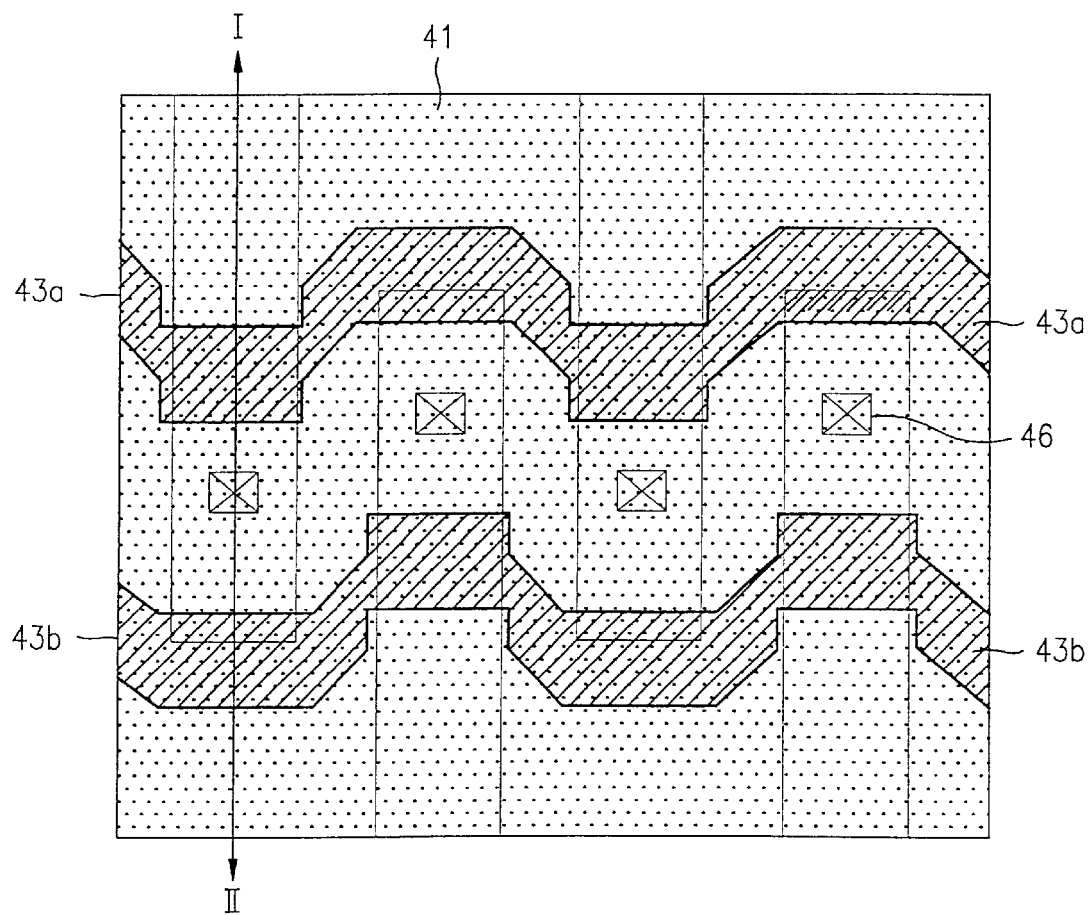
Figures 2, 4B:
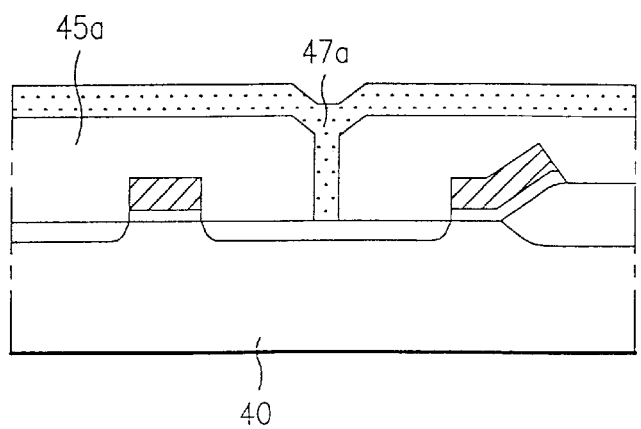

As shown in FIG. 4b, a first interlevel insulating layer 45a is formed on the entire surface of the semiconductor substrate 40 and then patterned to expose any one region of the source/drain regions 44a and 44b, so that a storage node contact hole 46 is formed.

Subsequently, a capacitor first electrode material layer 47a is formed on the entire surface including the storage node contact hole 46.

Figures 1, 4C:
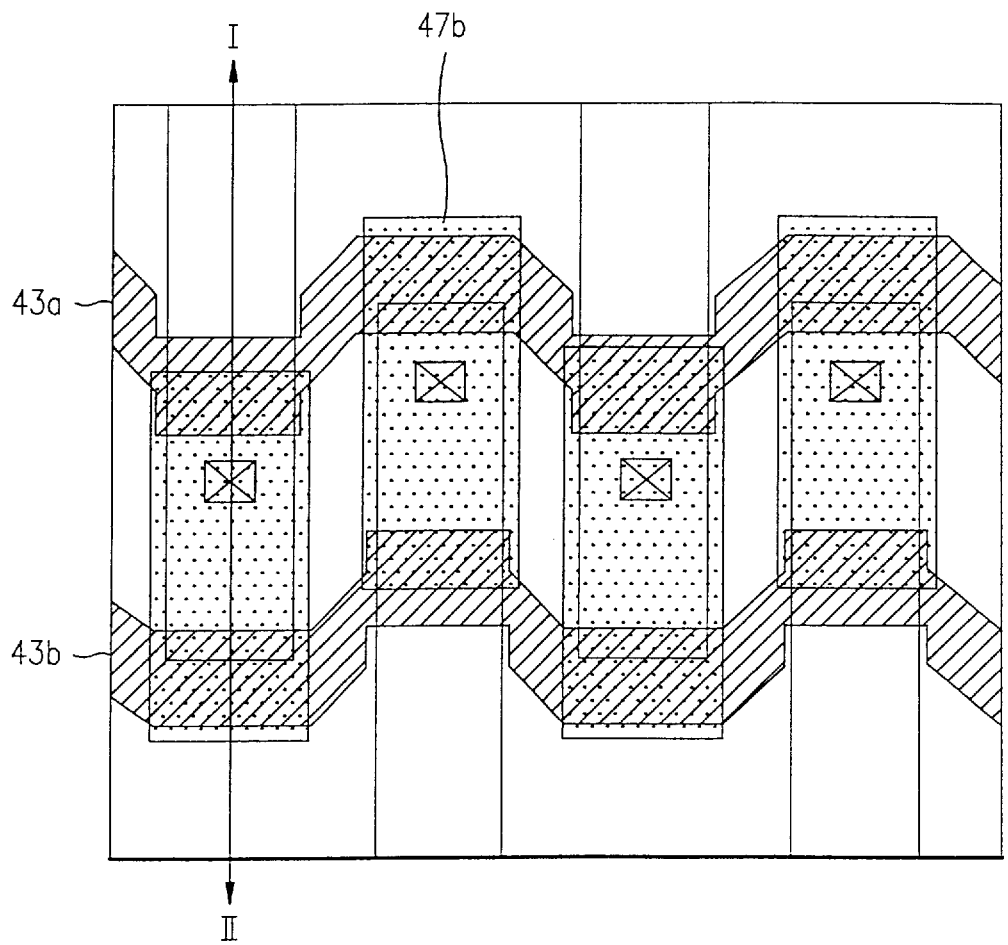
Figures 2, 4C:
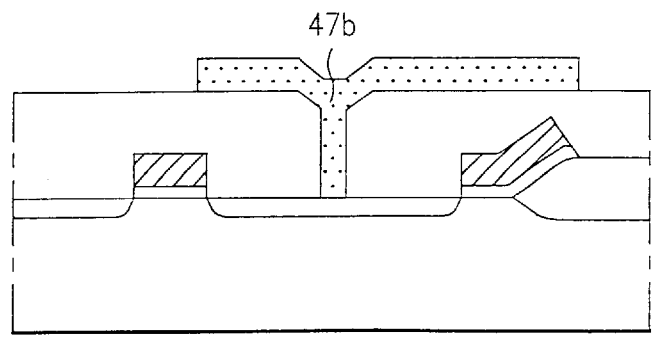

As shown in FIG. 4c, the capacitor first electrode material layer 47a is selectively patterned to form a capacitor first electrode 47b.

Figures 1, 4D:
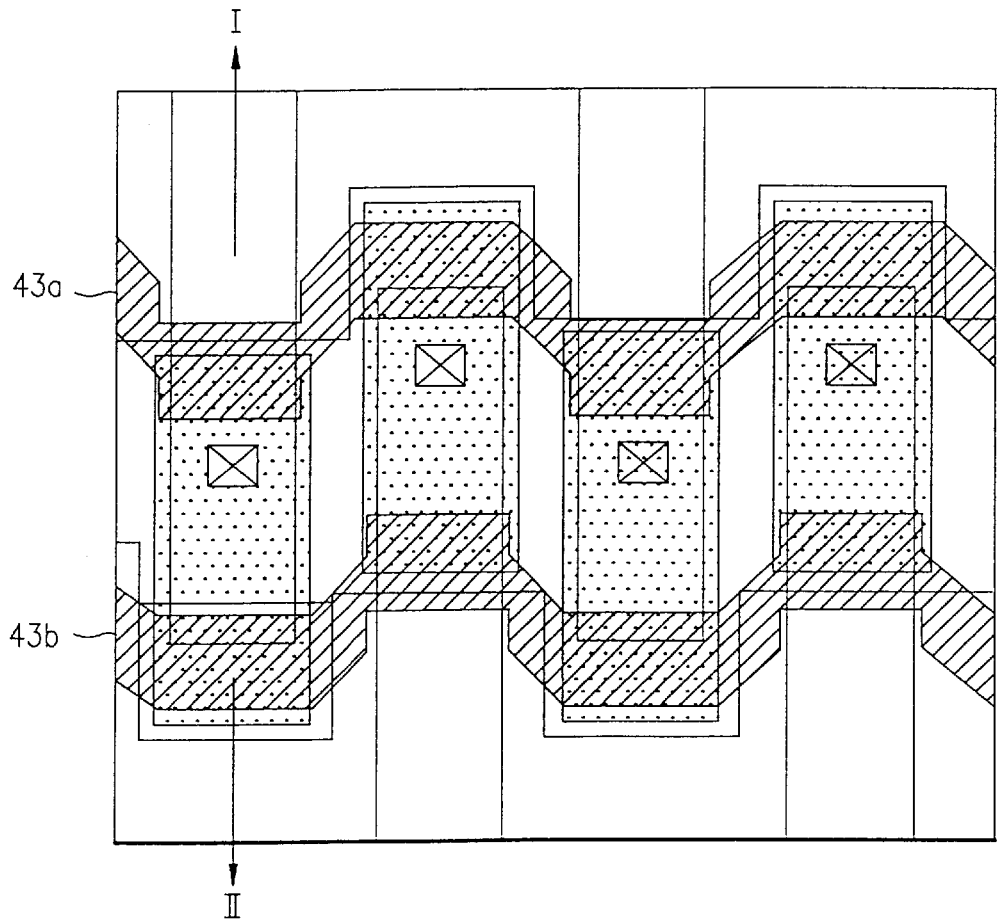
Figures 2, 4D:
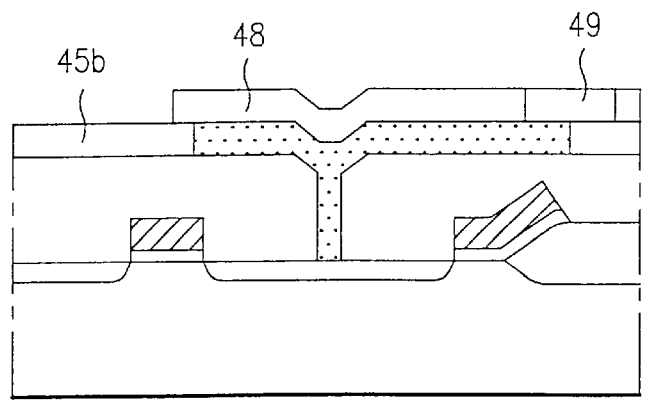

As shown in FIG. 4d, a second interlevel insulating layer 45b is formed on the entire surface including the capacitor first electrode 47b and then flattened. A ferroelectric material layer is deposited on the entire surface and selectively patterned to form a ferroelectric layer 48.

A photoresist layer (not shown) is formed on the entire surface including the ferroelectric layer 48 and patterned to expose some of the ferroelectric layer 48. Then, Impurity ions are selectively implanted into the entire surface using the patterned photoresist layer as a mask to form a resistor region 49.

Figures 1, 4E:
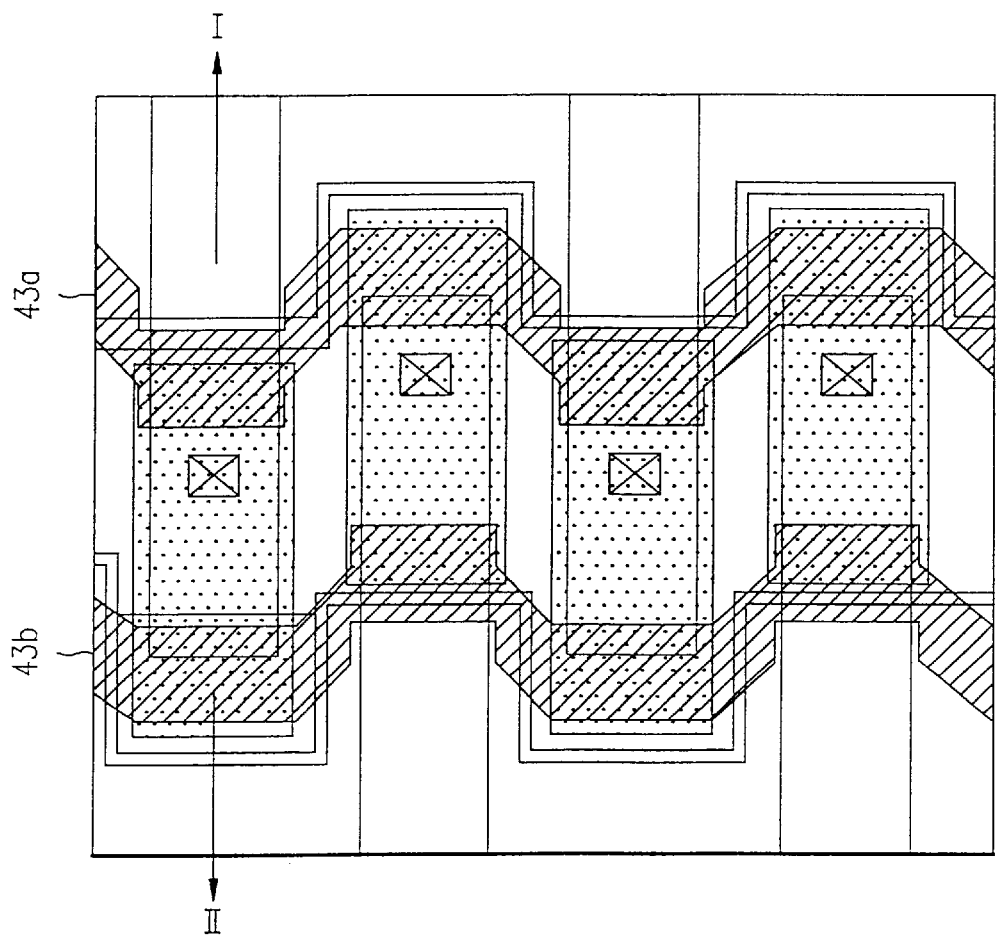
Figures 2, 4E:
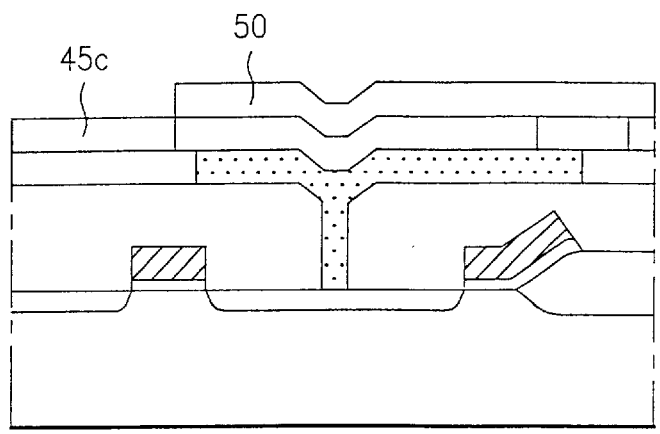

As shown in FIG. 4e, a third interlevel insulating layer 45c is formed on the entire surface including the ferroelectric layer 48 having the resistor region 49 and flattened. A capacitor second electrode material layer is then formed on the entire surface and selectively patterned to form a capacitor second electrode 50.

Figures 1, 4F:
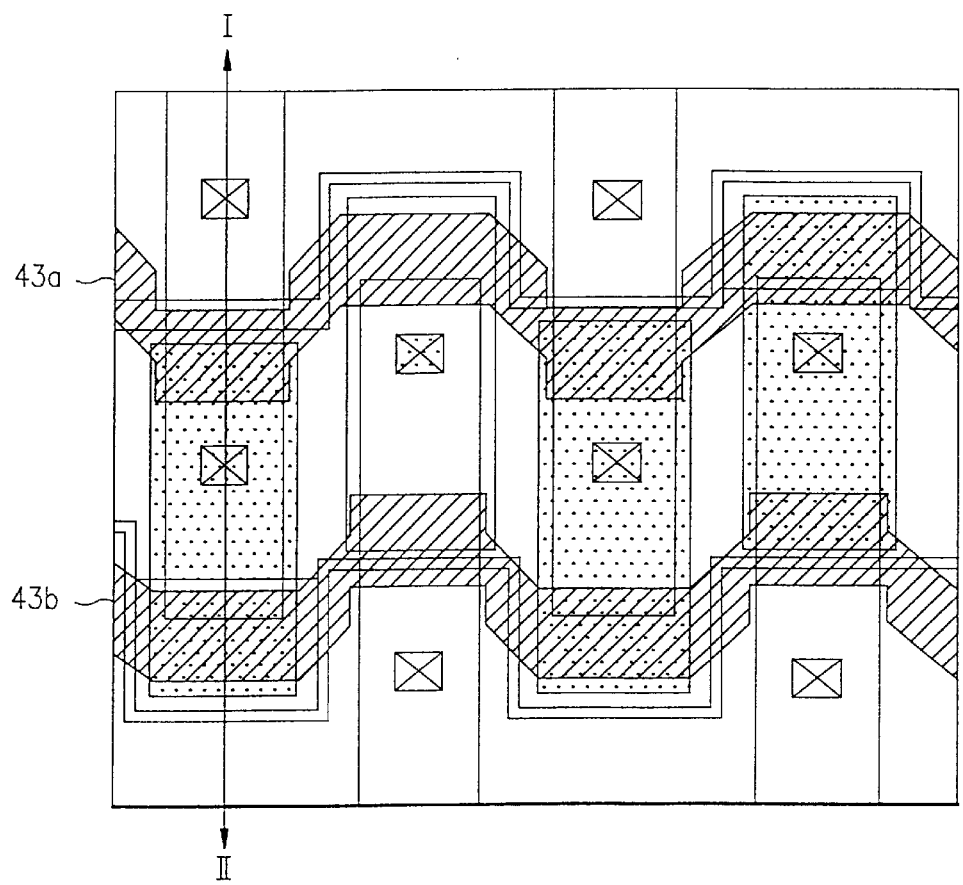
Figures 2, 4F:
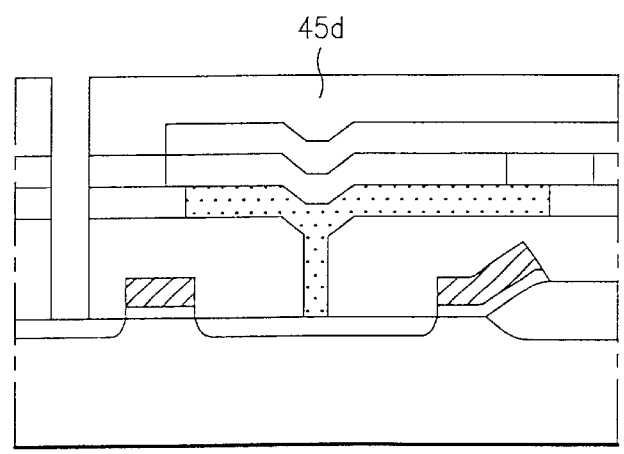

Subsequently, as shown in FIG. 4f, a fourth interlevel insulating layer 45d is formed on the entire surface including the capacitor second electrode 50 and selectively patterned to expose the other region of the source/drain regions 44a and 44b, so that a bitline contact hole is formed.

Figures 1, 4G:
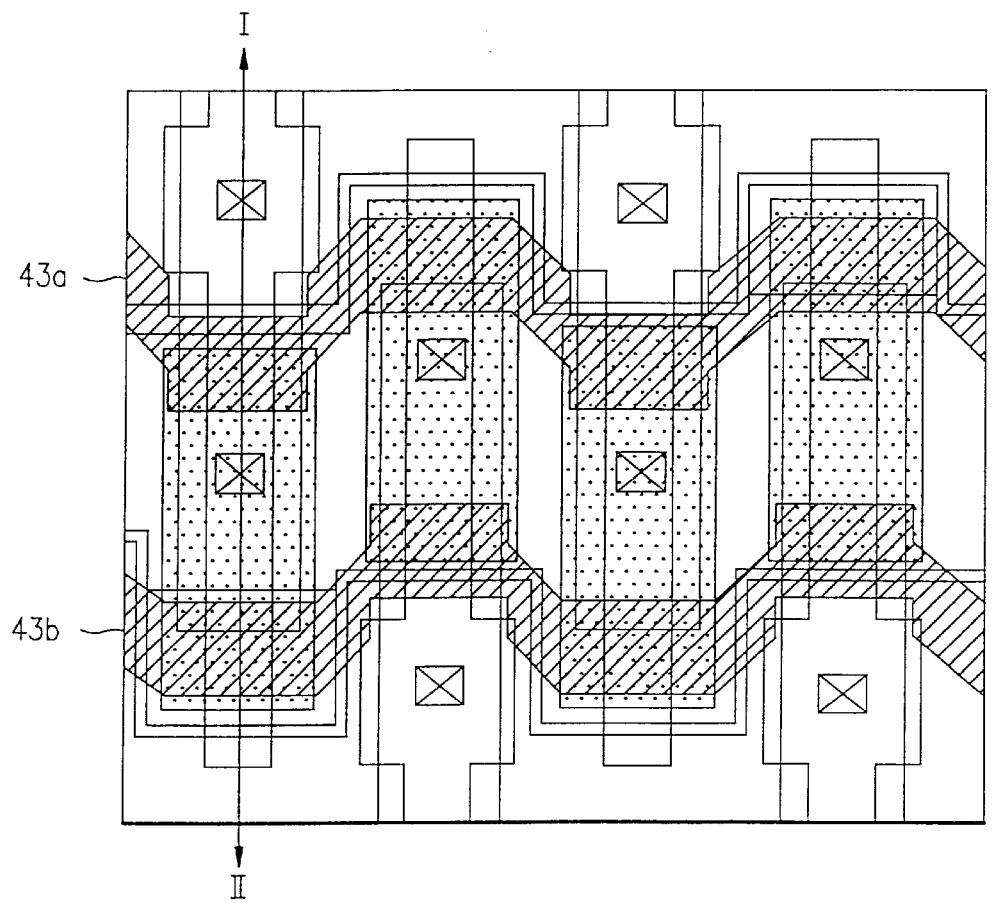
Figures 2, 4G:
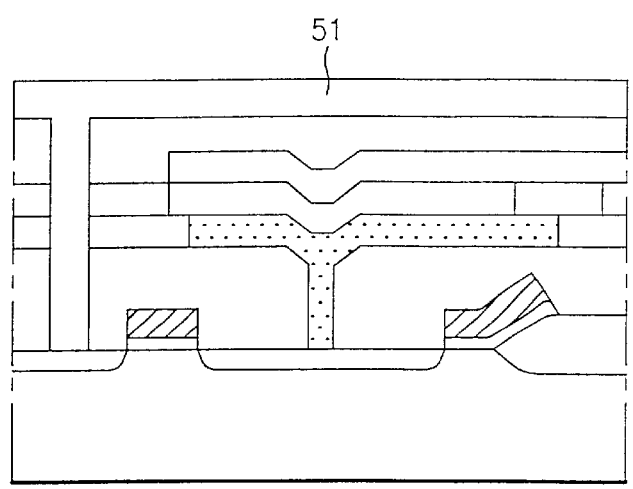

As shown in FIG. 4g, a bitline material layer is formed on the entire surface including the bitline contact hole and selectively patterned to form a bitline 51.

Now, instead of forming the resistor region 49 having high resist at some of the ferroelectric layer 48, the other embodiment of the present invention will be described below, in which a separate polysilicon layer, that is, a high resistor layer is formed between the ferroelectric layer 48 and the capacitor second electrode 50 to which Vcc/2 voltage is applied, to be connected with them.

Figure 5:
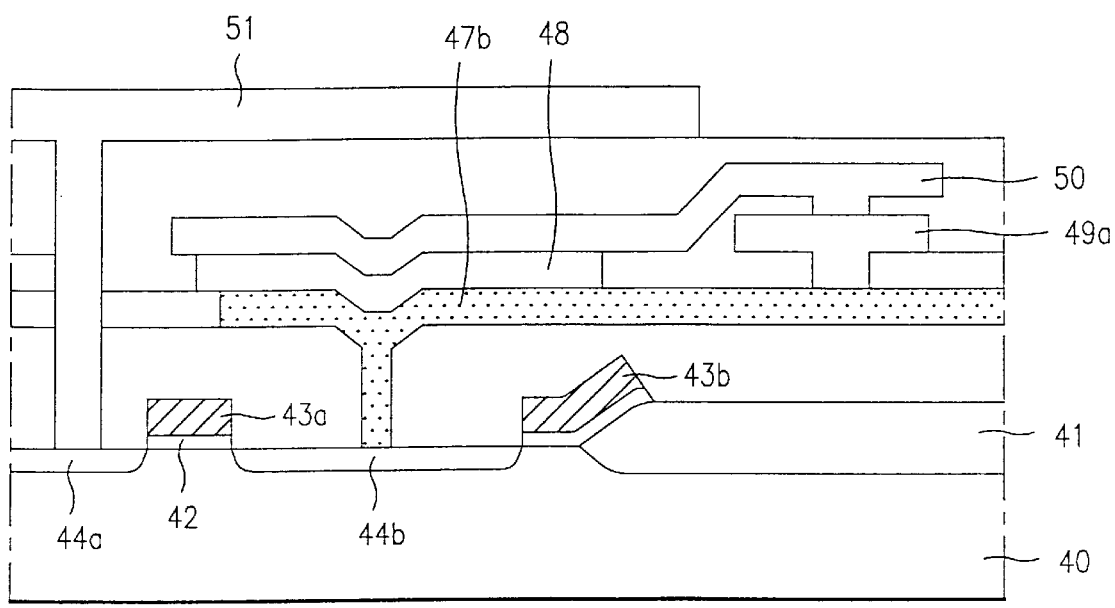
FIG. 5 is a sectional view illustrating a ferroelectric memory according to the other embodiment of the present invention.
Figure 6A:
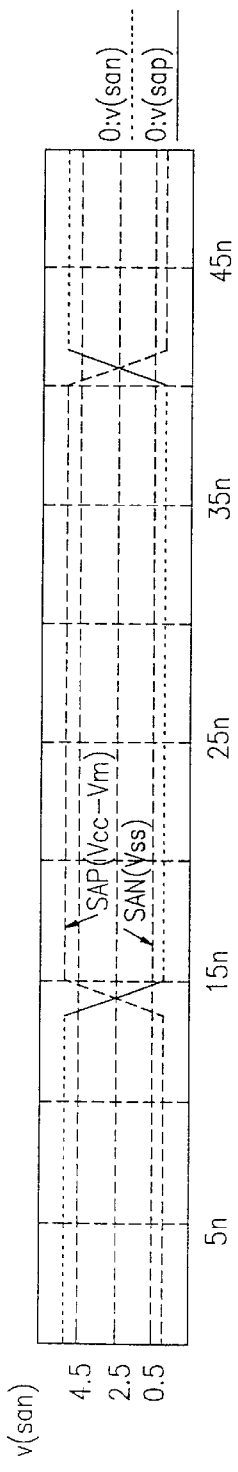
FIG. 6 are waveforms illustrating the operation of a ferroelectric memory according to the present invention.
Figure 6B:
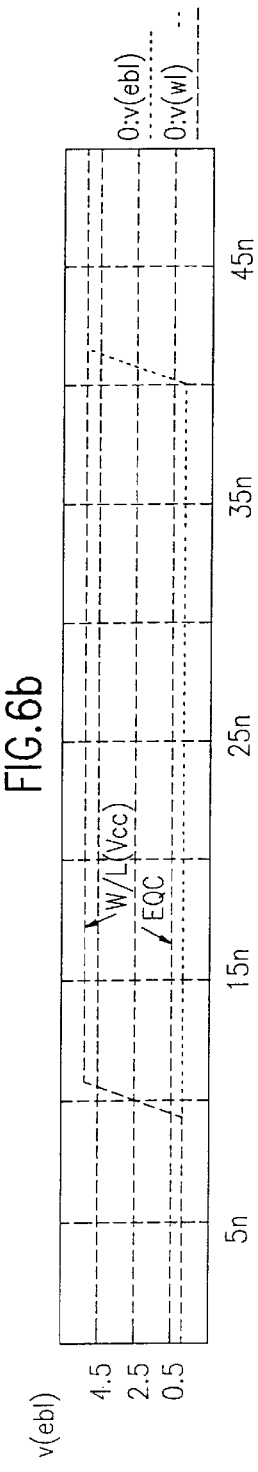
Figure 6C:
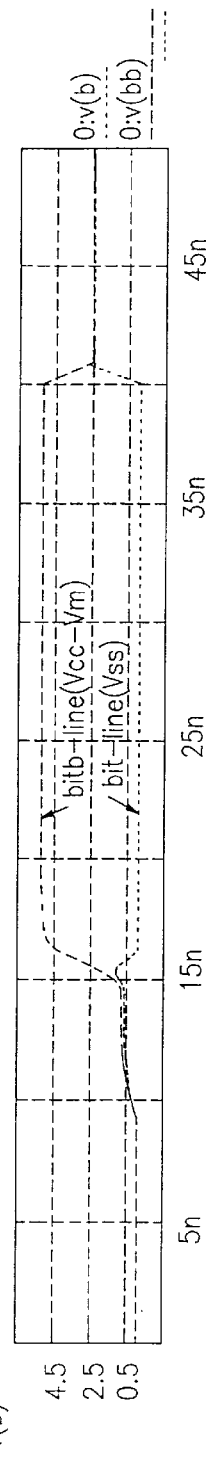
Figure 6D:
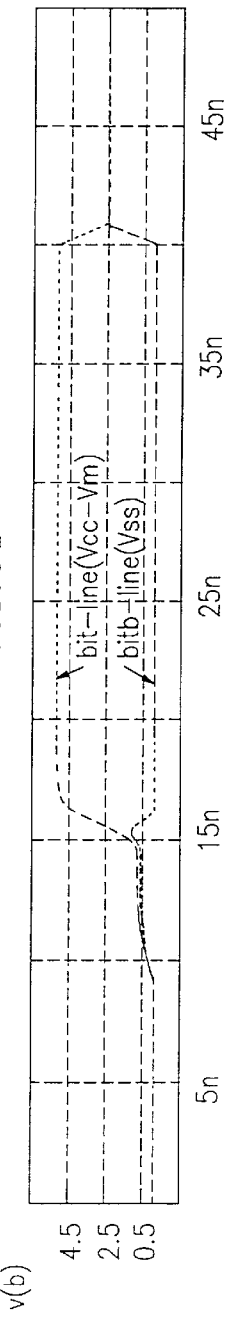

FIG. 5 is a sectional view illustrating a ferroelectric memory according to the other embodiment of the present invention.

As shown in FIG. 5, the nonvolatile ferroelectric memory according to the other embodiment of the present invention comprises a semiconductor substrate 40 including an active region defined by a device isolation layer 41, cell transistors including gate and source/drain regions in the active region of the semiconductor substrate 40, a capacitor first electrode 47b contacted with one region of the source/drain regions, a ferroelectric layer 48 formed on the capacitor first electrode 47b, a capacitor second electrode 50 formed on the ferroelectric layer 48, a high resistor layer 49a separated from the ferroelectric layer 48 and formed between the capacitor first electrode 47b and the capacitor second electrode 50, and a bitline 51 contacted with the other region of the source/drain regions of the cell transistors.

Data sensing operation of the nonvolatile ferroelectric memory according to the present invention will be described below.

FIG. 6 are waveforms of the ferroelectric memory according to the present invention.

In the nonvolatile ferroelectric memory of the present invention, the wordlines of the main memory cell block 31 and the reference memory cell block 32 are under the same control signal.

The pull-down control signal PDC pulls down the bitline and the bit bar line at Vss level. The pull-up control signal EQC pulls up the bit line and the bit bar line at Vcc/2 and equalizes them.

The sensing amplifier PMOS enable signal SAP and the sensing amplifier NMOS enable signal SAN which operate the sensing amplifier become low and high, respectively, during disable mode, while become high and low, respectively, during enable mode.

During reading mode, the pull-up control signal EQC is applied at low pulse and the pull-down control signal PDC is applied at high pulse, so that the bitline and the bit bar line become low potential. In this state, if high pulse is applied to the wordline to enable the wordline, the data of the main cell are transmitted to the bit line and the data of the reference cell are transmitted to the bit bar line.

In other words, in case of writing '0' in the main cell, the bitline and the bit bar line have Vss level, and after enabling the wordline in reading mode, the bitline level becomes slowly lower than the bit bar line level.

On the other hand, in case of writing '1' in the main cell, the bitline level is slowly higher than the bit bar line in a curved line of reading mode.

If sufficient data are loaded in the bitline and the bit bar line, the sensing amplifier is operated to output signals.

During disable mode, the SAP signal and the SAN signal become low and high, respectively, while, during enable mode, they become high and low, respectively.

At this time, the SAP signal level becomes Vcc-Vm so as not to damage the data of the reference cell after amplifying the sensing amplifier. Where, Vm is 1.0~2.0 V level and is determined by threshold voltage capable of causing polarity variation of the ferroelectric material. The cell plate node is maintained at Vcc/2 level.

After amplifying the sensing amplifier, the sensing amplifier is disabled prior to disabling the wordline and the bitline and the bit bar line become Vcc/2 level. This is to fix the inner nodes n1, n2, R1 and R2 of the cell at Vcc/2.

In other words, the voltage at both ends of the capacitor becomes 0V due to Vcc/2 applied to the bitline and the bit bar line, and the nodes n1, n2, Rn1 and Rn2 are continuously maintained at Vcc/2 level by means of current supply of the resistor devices.

The bitline level which will be input to the main cell in writing mode is full Vcc or Vss. The polarity of the ferroelectric material used as the capacitor dielectric is varied due to the voltage difference between the bitline level and Vcc/2 level of the cell plate.

In the same manner as the reading mode, after writing, the bitline and the bit bar line become Vcc/2 prior to disabling the wordline. This is to fix the inner nodes n1, n2, R2 and R2 of the cell at Vcc/2.

If the Vcc level signal is applied to the bitline, a signal having level '1' is written. If the Vss level signal is applied to the bitline, a signal having level '0' is written. A signal having level '0' is always written in the reference cell.

Therefore, during writing mode, the bitline level becomes full Vcc level, and during reading mode, the bitline and the bit bar line become Vcc–Vm level.

In the aforementioned operation, the resistor device between both ends of the capacitor has the resistor value determined to satisfy that junction leakage current of the NMOS transistor can be supplemented and the voltage difference between both ends of the capacitor during disabling the wordline does not exceed 1 V. During reading mode, prior to enabling the wordline, the resistor device value must be determined to allow the nodes n1, n2, R1 and R2 in the main cell and the reference cell to have the same level.

The capacitance in the reference cell is determined 1.5~3 times greater than the capacitance value of the main memory cell.

The aforementioned nonvolatile ferroelectric memory of the present has the following advantages.

Since a separate circuit for compensating a voltage of a node within the memory cell and a voltage compensating cycle are not required, memory cell access of non driven cell plate line method is possible, thereby simplifying the circuit structure and enabling fast access time.

It will be apparent to those skilled in the art that various modifications and variations can be made in the nonvolatile ferroelectric memory according to the present invention without departing from the spirit or scope of the invention. Thus, it is intended that the present invention covers the modifications and variations of the invention provided they come within the scope of the appended claims and their equivalents.

What is claimed is:

1. A method for forming a nonvolatile ferroelectric memory comprising:

forming a gate layer on a surface of a semiconductor substrate including an active region and selectively patterning the gate layer to form first and second wordlines;

implanting impurity ions into the active region using the first and second wordlines as masks to form source/drain regions;

forming an interlevel insulating layer on the surface of the semiconductor substrate and selectively patterning the interlevel insulating layer to expose any one region of the source/drain regions, thereby forming a storage node contact hole;

forming a capacitor first electrode material layer on the surface of the interlevel insulating layer including the storage node contact hole and selectively patterning the capacitor first electrode material layer to form a capacitor first electrode;

forming a ferroelectric layer on the capacitor first electrode and selectively implanting impurity ions into a portion of the ferroelectric layer to form a resistor region; and forming a bitline contacted with the other region of the source/drain regions.

2. A method according to claim 1 wherein the gate layer is polysilicon.

3. A method according to claim 1 wherein the active region of the semiconductor substrate is defined by a device isolation layer.

4. A method according to claim 1 wherein the process of forming a bitline contacted with the other region of the source/drain regions comprises forming a bitline insulation layer over the surface of the capacitor second electrode, selectively patterning the bitline insulation layer to expose the other region of the source/drain regions to form a bitline contact hole, and depositing a bitline material layer over the bitline insulation layer and into the bitline contact hole; and forming a bitline contacted with the other region of the source/drain regions.

5. A method according to claim 1 further comprising forming a gate oxide layer and wherein the gate layer is deposited over the gate oxide layer.

6. A method for forming a ferroelectric device comprising:

forming a patterned gate material layer on a semiconductor substrate including an active region, the patterned gate material layer forming first and second wordlines;

forming source and drain regions electrically coupled to the first and second wordlines;

forming a patterned interlevel insulating layer over the wordlines and the semiconductor substrate, the interlevel insulating layer having a portion configured to expose any one region of the source/drain regions, thereby forming a contact hole;

forming a capacitor first electrode material layer on the interlevel insulation layer and in the storage node contact hole to form a capacitor first electrode;

forming a ferroelectric layer on a first portion of the capacitor first electrode;

forming a resistor in a portion of the ferroelectric layer;

forming a capacitor second electrode on a portion of the ferroelectric layer and a portion of the resistor;

forming a bitline contacted with the other region of the source/drain regions.

7. A method according to claim 6 wherein the gate material is polysilicon.

8. A method according to claim 6 wherein the active region of the semiconductor substrate is defined by a device isolation layer.

9. A method according to claim 6 wherein the process of forming a bitline contacted with the other region of the source/drain regions comprises forming a bitline insulation layer over the surface of the capacitor second electrode, selectively patterning the bitline insulation layer to expose the other region of the source/drain regions to form a bitline contact hole, and depositing a bitline material layer over the bitline insulation layer and into the bitline contact hole; and forming a bitline contacted with the other region of the source/drain regions.

10. A method according to claim 6 further comprising forming a gate oxide layer and wherein the gate material is deposited over at least a portion of the gate oxide layer.

11. A method according to claim 6 wherein the process of forming a patterned gate material layer comprises depositing a gate material layer over a surface of the semiconductor substrate followed by patterning.

12. A method according to claim 6 wherein the process of forming source/drain regions comprises ion implantation using the first and second wordlines as ion implantation masks.

13. A method according to claim 6 wherein the process of forming the resistor comprises ion implantation into a portion of the ferroelectric layer.

14. A method for forming a ferroelectric device comprising:

forming a patterned gate material layer on a semiconductor substrate including an active region, the patterned gate material layer forming first and second wordlines;

forming source and drain regions electrically coupled to the first and second wordlines;

forming a patterned interlevel insulating layer on the surface of the semiconductor substrate having a portion configured to expose any one region of the source/drain regions, thereby forming a storage node contact hole;

forming a capacitor first electrode material layer on the interlevel insulation layer and in the storage node contact hole to form a capacitor first electrode;

forming a ferroelectric layer on a first portion of the capacitor first electrode;

forming a resistor layer on a second portion of the capacitor first electrode;

forming a capacitor second electrode on a portion of the ferroelectric layer and a portion of the resistor layer;

forming a bitline contacted with the other region of the source/drain regions.

15. A method according to claim 14 wherein the gate material is polysilicon.

16. A method according to claim 14 wherein the active region of the semiconductor substrate is defined by a device isolation layer.

17. A method according to claim 14 wherein the process of forming a bitline contacted with the other region of the source/drain regions comprises forming a bitline insulation layer over the surface of the capacitor second electrode, selectively patterning the bitline insulation layer to expose the other region of the source/drain regions to form a bitline contact hole, and depositing a bitline material layer over the bitline insulation layer and into the bitline contact hole; and forming a bitline contacted with the other region of the source/drain regions.

18. A method according to claim 14 further comprising forming a gate oxide layer and wherein the gate material is deposited over at least a portion of the gate oxide layer.

19. A method according to claim 14 wherein the process of forming a patterned gate material layer comprises depositing a gate material layer over a surface of the semiconductor substrate followed by patterning.

20. A method according to claim 14 wherein the process of forming source/drain regions comprises ion implantation using the first and second wordlines as ion implantation masks.

21. A method for forming a ferroelectric device comprising:

forming a capacitor lower electrode on a substrate;

forming a ferroelectric layer on the capacitor lower electrode;

converting a portion of the ferroelectric layer into a resistor; and forming a capacitor upper electrode on the ferroelectric layer.

22. A method according to claim 21 wherein converting a portion of the ferroelectric layer into a resistor is performed by ion implementation of a portion of the ferroelectric layer.

23. A method according to claim 21 wherein the upper and lower capacitor electrodes are in contact with the resistor.

* * * * *